(12) United States Patent
Kim et al.

(10) Patent No.: US 7,396,719 B2
(45) Date of Patent: Jul. 8, 2008

(54) METHOD OF FORMING HIGH DIELECTRIC FILM USING ATOMIC LAYER DEPOSITION AND METHOD OF MANUFACTURING CAPACITOR HAVING THE HIGH DIELECTRIC FILM

(75) Inventors: Kyoung-seok Kim, Seoul (KR); Hong-bae Park, Seoul (KR); Bong-hyun Kim, Incheon Metropolitan (KR); Sung-tae Kim, Seoul (KR); Jong-wan Kwon, Gyeonggi-do (KR); Jung-hyun Lee, Gyeonggi-do (KR); Ki-chul Kim, Gyeonggi-do (KR); Jae-soon Lim, Seoul (KR); Gab-jin Nam, Seoul (KR); Young-sun Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 93 days.

(21) Appl. No.: 10/873,256

(22) Filed: Jun. 23, 2004

(65) Prior Publication Data
US 2004/0266217 A1    Dec. 30, 2004

(30) Foreign Application Priority Data
Jun. 24, 2003    (KR) .................... 10-2003-0041227
Dec. 27, 2003    (KR) .................... 10-2003-0098232

(51) Int. Cl.
*H01L 21/471* (2006.01)
(52) U.S. Cl. .............. 438/240; 438/591; 438/785; 257/E21.625
(58) Field of Classification Search ............... 438/785
See application file for complete search history.

(56) References Cited

U.S. PATENT DOCUMENTS

| 6,607,973 B1* | 8/2003 | Jeon .................. 438/591 |
| 2004/0144980 A1* | 7/2004 | Ahn et al. ............ 257/69 |
| 2004/0198069 A1* | 10/2004 | Metzner et al. ....... 438/785 |

FOREIGN PATENT DOCUMENTS

| KR | 2001-0063452 | 7/2001 |
| KR | 2002-0002156 | 1/2002 |
| KR | 2000-0013654 | 3/2003 |

* cited by examiner

*Primary Examiner*—Stephen W Smoot
(74) *Attorney, Agent, or Firm*—Volentine & Whitt, PLLC

(57) ABSTRACT

A method of forming a high dielectric film using atomic layer deposition (ALD), and a method of manufacturing a capacitor having the high dielectric film, include supplying a precursor containing a metal element to a semiconductor substrate and purging a reactor; supplying an oxidizer and purging the reactor; and supplying a reaction source containing nitrogen and purging the reactor.

4 Claims, 8 Drawing Sheets

METHOD OF FORMING HIGH DIELECTRIC FILM USING ATOMIC LAYER DEPOSITION AND METHOD OF MANUFACTURING CAPACITOR HAVING THE HIGH DIELECTRIC FILM

CROSS REFERENCES TO RELATED APPLICATIONS

This application claims priority under 35 U.S.C. § 119 from Korean Patent Application No. 2003-41227, filed on 24 Jun. 2003, and from Korean Patent Application No. 2003-98232, filed on 27 Dec. 2003, the contents of each of which are hereby incorporated by reference in their entirety for all purposes as if fully set forth herein.

BACKGROUND AND SUMMARY

1. Technical Field

The present invention relates to a method of forming a high dielectric film used in a semiconductor device and a method of manufacturing a capacitor, and more particularly, to a method of forming a high dielectric film using atomic layer deposition (ALD) and a method of manufacturing a capacitor having the high dielectric film.

2. Description of the Related Art

As the integration density and capacitance of semiconductor devices have increased, there have been intensive studies on formation of gate insulating films or capacitor dielectric films of MOSFETs using high dielectric materials. When a high dielectric film is formed as a gate insulating film, since the high dielectric film having the same equivalent oxide thickness (Toxeq) as an $SiO_2$ film has a greater thickness than the $SiO_2$ film, a rapid increase in leakage current due to tunneling of electrons can be reduced. For example, when an $SiO_2$ film is used as a gate insulating film, if the $SiO_2$ film has a thickness of 15 Å or less, a leakage current dramatically increases due to tunneling. However, when the gate insulating film is formed of a high dielectric material such as $HfO_2$, $ZrO_2$, $Ta_2O_5$, or $TiO_2$, even if the high dielectric film has the same equivalent oxide thickness (Toxeq) as the $SiO_2$ film, a rapid increase in leakage current can be prevented.

However, when a gate insulating film of a MOSFET device is formed of a high dielectric film, some problems are generated. For example, when a gate insulating film is formed of a high dielectric material such as $HfO_2$ or $ZrO_2$, dopant diffusion of B, P, or As from an upper polysilicon gate electrode lowers carrier mobility in channels. Also, a high dielectric film formed of $HfO_2$ may be easily crystallized by a subsequent annealing process, thus causing current leakage. Accordingly, to form a gate insulating film using a high dielectric material, dopant diffusion from the upper polysilicon gate electrode should be suppressed, and thermal stability should be secured during an annealing process.

To prevent dopant diffusion and secure thermal stability, research for obtaining a high dielectric oxynitride film, such as an HfON film and a ZrON film, by adding nitrogen to a high dielectric oxide film, such as an $HfO_2$ film or a $ZrO_2$ film, has progressed. If the high dielectric oxynitride film is formed by adding nitrogen to the high dielectric oxide film, such as the $HfO_2$ film or the $ZrO_2$ film, diffusion of impurities from an upper electrode can be prevented, and thermal stability can be ensured by raising the crystallization temperature of the high dielectric film. To form the oxynitride film, such as the HfON film and the ZrON film, an oxide film, such as an $HfO_2$ film or a $ZrO_2$ film, can be deposited and annealed in an atmosphere of $NH_3$ or $N_2O$. However, this method cannot easily obtain a desired profile of nitrogen in a thin film formed of $HfO_2$ or $ZrO_2$, and should include an additional $N_2$-annealing process after the oxide film is deposited.

To form a high dielectric oxynitride film, a method of depositing an HfON film by ALD using a new Hf precursor containing nitrogen has been developed. However, since N—C coupling in the N-containing precursor, such as $Hf[N(CH_3)_2]_4$, is very great, even if an HfON film is deposited using an oxidizer such as $H_2O$, carbon remains in the HfON film. The remaining carbon degrades the electrical characteristics of the HfON film.

FIG. 1 is a graph of current density versus applied voltage in a metal oxide semiconductor (MOS) transistor that uses a conventional HfON film formed by ALD as a gate insulating film. In FIG. 1, a solid curve corresponds to an HfON film as deposited, and a dotted curve corresponds to an HfON film that has been annealed in an atmosphere of $N_2$ at a temperature of about 800° C. Both films are formed by ALD using a precursor of $Hf[N(CH_3)_2]_4$ and an oxidizer of $H_2O$ at a temperature of about 300° C. Each of the HfON films is formed by repeatedly supplying the precursor $Hf[N(CH_3)_2]_4$, purging a reactor, supplying the oxidizer $H_2O$, and purging the reactor several times.

Referring to FIG. 1, the conventional HfON film deposited using ALD (the solid curve) exhibited a degraded leakage current characteristic. Specifically, when the applied voltage was −2V, the density of the leakage current was about 0.5 $A/cm^2$. Even when the HfON film was annealed in an atmosphere of $N_2$ at a temperature of about 800° C., the leakage current characteristic of the HfON film did not improve significantly. This is because the conventional HfON film contained a considerable amount of carbon or had numerous defects.

FIG. 2 is a graph showing a TOF-secondary ion mass spectrometer (TOF-SIMS) analysis of a conventional HfON film deposited using ALD. The TOF-SIMS analysis is employed for the qualitative and quantitative analysis of elements. Referring to FIG. 2, the conventional HfON formed by ALD contains a large amount of carbon, which degrades the leakage current characteristic of the HfON thin film. FIG. 3 is a graph showing a TOF-SIMS analysis of a conventional HfON film deposited by ALD and then annealed. As can be seen from FIG. 3, even if annealed, the HfON film still contains a large amount of carbon. Thus, the electrical characteristics of the HfON film are degraded. As a result, when the HfON film is formed by ALD using the precursor $Hf[N(CH_3)_2]_4$, although dopant diffusion can be prevented by the N-containing precursor, a thin film characteristic is degraded since the amount of carbon in the HfON film increases. Also, the carbon in the HfON film cannot be removed by an additional annealing process.

Meanwhile, with the increasing integration density of semiconductor devices, while the capacitance of a capacitor per cell required for stable driving of devices remains constant, the area of each cell that is available for the capacitor decreases. Thus, the integration density of semiconductor devices is reaching a technical limit. To overcome the technical limit, increasing the electric charge per cell by increasing the capacitance of the capacitor is needed. The capacitance of the capacitor can be increased by raising the dielectric constant of a capacitor dielectric film. Techniques of replacing a conventional $SiO_2$ film having a dielectric constant of about 3.9, a $Si_3N_4$ film having a dielectric constant of about 7.2, or an ONO film having a dielectric constant of about 3.9-7.2, by a high dielectric film have been developed.

Substitutable high dielectric film candidates include a $Ta_2O_5$ film having a dielectric constant of 20-60, an $HfO_2$ film having a dielectric constant of about 20, a $TiO_2$ film having a dielectric constant of about 40, an $Al_2O_3$ film having a dielectric constant of about 10, an $La_2O_3$ having a dielectric constant of about 20, and ferroelectric combination films, such as PZT, PLZT, BST, and STO, whose dielectric constants range from several tens to several hundreds. However, all of these high dielectric films cannot necessarily be applied to semiconductor devices. Whether or not a new dielectric material can be applied to a semiconductor device is determined in consideration of suitableness to conventional semiconductor fabrication, stability of electrode patterns and etching processes, stability of device fabrication, mass production, economic efficiency, and stability of device operation.

A dielectric film can be deposited using various methods, such as chemical vapor deposition (CVD), physical vapor deposition (PVD), or atomic layer deposition (ALD). When a capacitor having a 3-dimensional lower electrode is formed, the dielectric film is preferably formed using CVD or ALD. The CVD or ALD process requires precursors and oxidizers. A high dielectric film can be deposited using: (1) a precursor, for example, metal halides, such as metal chlorides, and metal organic (MO) sources, such as metal alkoxides and metal β-diketonates; and (2) an oxidizer, such as $O_2$, $O_3$, or $H_2O$.

In the CVD method, thin films are formed by simultaneously supplying source gases for forming films, such as the precursors and oxidizers, to reactors. However, in the ALD method, the source gases for forming films are not simultaneously supplied, but are supplied in pulses by time division, and every step of supplying a source gas is directly followed by a purge step using an inert gas, so that the remaining gas or by-products are removed.

For example, after a precursor is supplied to a reactor, if the reactor is purged by supplying an inert gas as a purging gas, while a thin chemisorbed precursor remains on a wafer on the atomic-size level, other precursors are exhausted from the reactor. In this state, if an oxidizer is supplied to the reactor, the oxidizer reacts with the precursor remaining on the wafer, thus generating a thin dielectric film or metal oxide film on the near-atomic level. Thereafter, the reactor is purged to remove a physisorbed oxidizer or by-products. As described above, a process including supplying a precursor, purging a reactor, supplying an oxidizer, and purging the reactor is called one cycle of ALD, and a resulting film can be formed to a desired thickness by controlling the number of cycles. It is known that the ALD method is superior to the CVD method in that the ALD method can produce films with good characteristics and good step coverage for a 3-dimensional structure, and can easily control the thickness of a thin dielectric film. Accordingly, as design rules for semiconductor devices such as DRAMs decrease, it is preferable to form a high dielectric film using ALD.

When a high dielectric film is deposited using ALD, it is preferable to form a combination film formed of several high dielectric materials rather than a single film formed of a certain high dielectric material, considering dielectric characteristics. Normally, any single film formed of a certain high dielectric material has some defects. For example, an $HfO_2$ film, which has a dielectric constant of about 20 and is formed by ALD, is easily crystallized at a temperature of only about 400° C. If the $HfO_2$ film is crystallized, after a capacitor is manufactured, a leakage current flows between crystal grains to deteriorate the electrical characteristics of the capacitor. For this reason, a high dielectric film formed by ALD is required to have a high dielectric constant and also remain amorphous at a relatively high temperature.

To form an amorphous high dielectric film using ALD, in a first method, a combination film can be formed by laminating two different kinds of high dielectric oxide films. For example, an $Al_2O_3$ film and an $HfO_2$ film can be laminated using ALD to form a combination film. Although the $Al_2O_3$ film has a lower dielectric constant than the $HfO_2$ film, since the crystallization temperature of the $Al_2O_3$ film is higher than 900° C., the resulting combination film is not crystallized during typical semiconductor processes. The dielectric constant and crystallization of the combination film that is formed by laminating the $Al_2O_3$ film and the $HfO_2$ film depend on a ratio of Al to Hf in the combination film. That is, if a ratio of Hf to Al+Hf increases, the dielectric constant and crystallization of the combination film increase, and if a ratio of Al to Hf+Al increases, the dielectric constant and crystallization thereof decrease. Korean Patent Laid-open Publication No. 2001-0063452 proposes a method of alternately laminating a $Ta_2O_5$ film and a $TiO_2$ film using ALD and converting the stack film of $Ta_2O_5$ and $TiO_2$ into a single compound film by a subsequent annealing process.

Secondly, an amorphous high dielectric film can be formed using ALD by adding nitrogen to a high dielectric material. For example, an $HfO_2$ film is deposited using ALD and annealed in an $N_2$ atmosphere, thereby forming an HfON film. Although the HfON film has a slightly lower dielectric constant than an $HfO_2$ film, the crystallization temperature of the HfON film is higher than that of the $HfO_2$ film. Thus, the HfON film can retain more stable leakage current characteristics than the $HfO_2$ film. Also, as described above, the nitrogen contained in the HfON film prevents diffusion of impurities from upper and lower electrodes, and thus the HfON film can be a stable dielectric film. However, a desired profile of nitrogen in the HfON film cannot be easily obtained by $N_2$-annealing, and a subsequent nitridation process is required. Thus, Korean Patent Laid-open Publication No. 2000-0013654 discloses a method of forming an AlON film by annealing an AlN film, which is formed using ALD, in an $O_2$ atmosphere.

Thirdly, an amorphous high dielectric film, which is formed using ALD, can be a combination film formed of three or more elements. For example, an HfON film and an AlON film are laminated using ALD, thereby forming a combination film formed of HfON/AlON. It is expected that this combination film has the advantages of both the foregoing stack film of $HfO_2$ and $Al_2O_3$, and an HfON film. That is, by adding nitrogen to the combination oxide film, the resulting high dielectric film can function as a barrier to diffusion of impurities and retain a high dielectric constant and high crystallization temperature with only a small concentration of Al. Korean Patent Laid-open Publication No. 2002-0002156 discloses a method of laminating $TiO_2$ and TaON using ALD and forming a combination film of TaON and $TiO_2$ by a subsequent annealing process. As it is difficult to form a desired high dielectric combination film by CVD, the ALD method is preferred here. When the combination film is deposited using ALD, a combination film having a desired thickness and composition can be formed by controlling the order in which source gases are supplied and the number of cycles.

However, since the method of forming a high dielectric combination film using ALD includes many steps of supplying gases along with purge steps, the method impedes the mass production of semiconductor devices. For instance, when a combination film is formed of a stack film of HfON and AlON, exceedingly numerous processes should be performed, such as supplying $HfCl_4$ as an Hf source gas, purging a reactor, supplying $O_2$, purging the reactor, $N_2$-annealing, supplying trimethyl aluminum (TMA) as an Al source gas, purging the reactor, supplying $O_2$, purging the reactor, and $N_2$-annealing, thus inhibiting mass production.

Thus it would be desirable to provide a method of forming a high dielectric film using ALD that improves a leakage current characteristic of the high dielectric film by reducing defects such as carbon and precisely controls the amount of nitrogen in the high dielectric film.

It would also be desirable to provide a method of forming a high dielectric combination film using ALD that facilitates mass production, precisely controls the composition and the thickness of the high dielectric combination film, and retains a stable leakage current characteristic.

It would further be desirable to provide a method of manufacturing a capacitor including the high dielectric combination film formed by either of the foregoing methods.

According to one aspect of the present invention, there is provided a method of forming a high dielectric film using atomic layer deposition, comprising (a) supplying a precursor containing a metal element to a semiconductor substrate and purging a reactor; (b) supplying an oxidizer and purging the reactor; and (c) supplying a reaction source containing nitrogen and purging the reactor. Step (c) can be performed before or after step (b). Step (b) and step (c) can be performed at the same time. After performing step (c), the method can further comprise supplying an oxidizer and purging the reactor.

The precursor containing the metal element can be an Hf precursor formed of a combination of Hf and one of O, C, H, and N, and the high dielectric film can be an HfON film. The Hf precursor can be one selected from the group consisting of $Hf[N(CH_3)_2]_4$, $Hf[N(C_2H_5)_2]_4$, and $Hf[N(C_2H_5)CH_3]_4$.

The oxidizer can be one selected from the group consisting of $O_3$, $H_2O$, $H_2O_2$, $CH_3OH$, $C_2H_5OH$, and $C_3H_7OH$. The reaction gas containing the nitrogen can be one selected from the group consisting of $NH_3$ gas, $N_2O$ gas, NO gas, and $NH_3$ plasma.

The high dielectric film can be one selected from the group consisting of N-augmented $ZrO_2$, N-augmented ZrON, N-augmented $Al_2O_3$, N-augmented $Ta_2O_5$, N-augmented $TiO_2$, N-augmented $SrTiO_3$, N-augmented TiAlO, N-augmented HfAlO, N-augmented HfTiO, and a combination thereof. The precursor can be combined with one of O, C, H, and N.

The high dielectric film can be used as a gate insulating film of a semiconductor device. The high dielectric film can be used as a capacitor dielectric film.

According to another aspect of the present invention, there is provided a method of forming a high dielectric film on a semiconductor substrate using atomic layer deposition, comprising (a) supplying a first reaction source containing a first metal element and purging a reactor; (b) supplying a second reaction source containing a second metal element and purging the reactor, the second metal element being different from the first metal element; (c) supplying a third reaction source containing N; and (d) supplying an oxidizer and purging the reactor.

After performing step (b), the method can further comprise supplying the first reaction source and purging the reactor.

After performing step (d), the method can further comprise performing an annealing process to densify the high dielectric film. The annealing process can be performed in an atmosphere of one selected from the group consisting of $O_2$, $O_3$, $N_2O$, Ar, $N_2$, $H_2$, He, $NH_3$, and a combination thereof, at a temperature of room temperature to 600° C., under a pressure of about 0.1 to 760 Torr.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
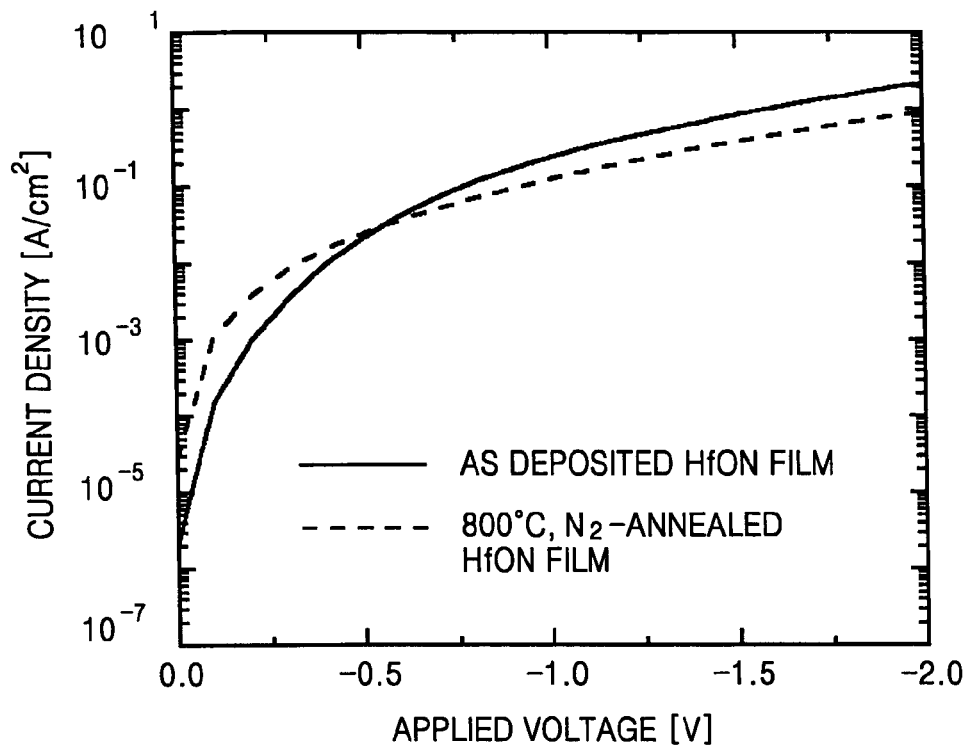
FIG. 1 is a graph of current density versus applied voltage in a MOS transistor that uses a conventional HfON film formed by ALD as a gate insulating film.
Figure 2:
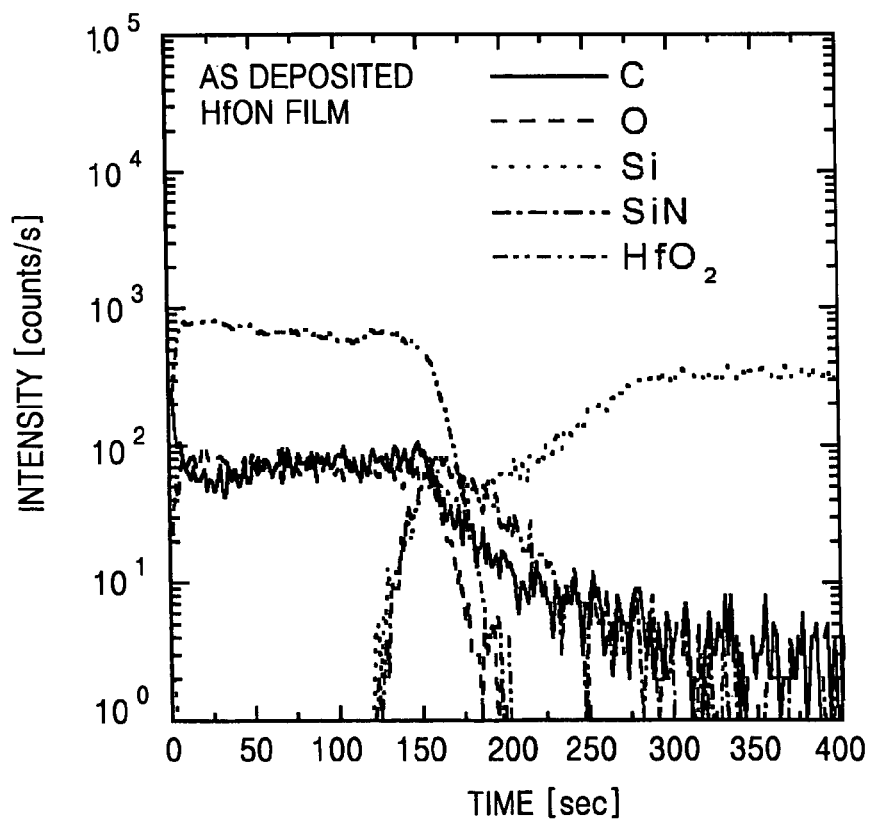
FIG. 2 is a graph showing a TOF-SIMS analysis of a conventional HfON film deposited using ALD.
Figure 3:
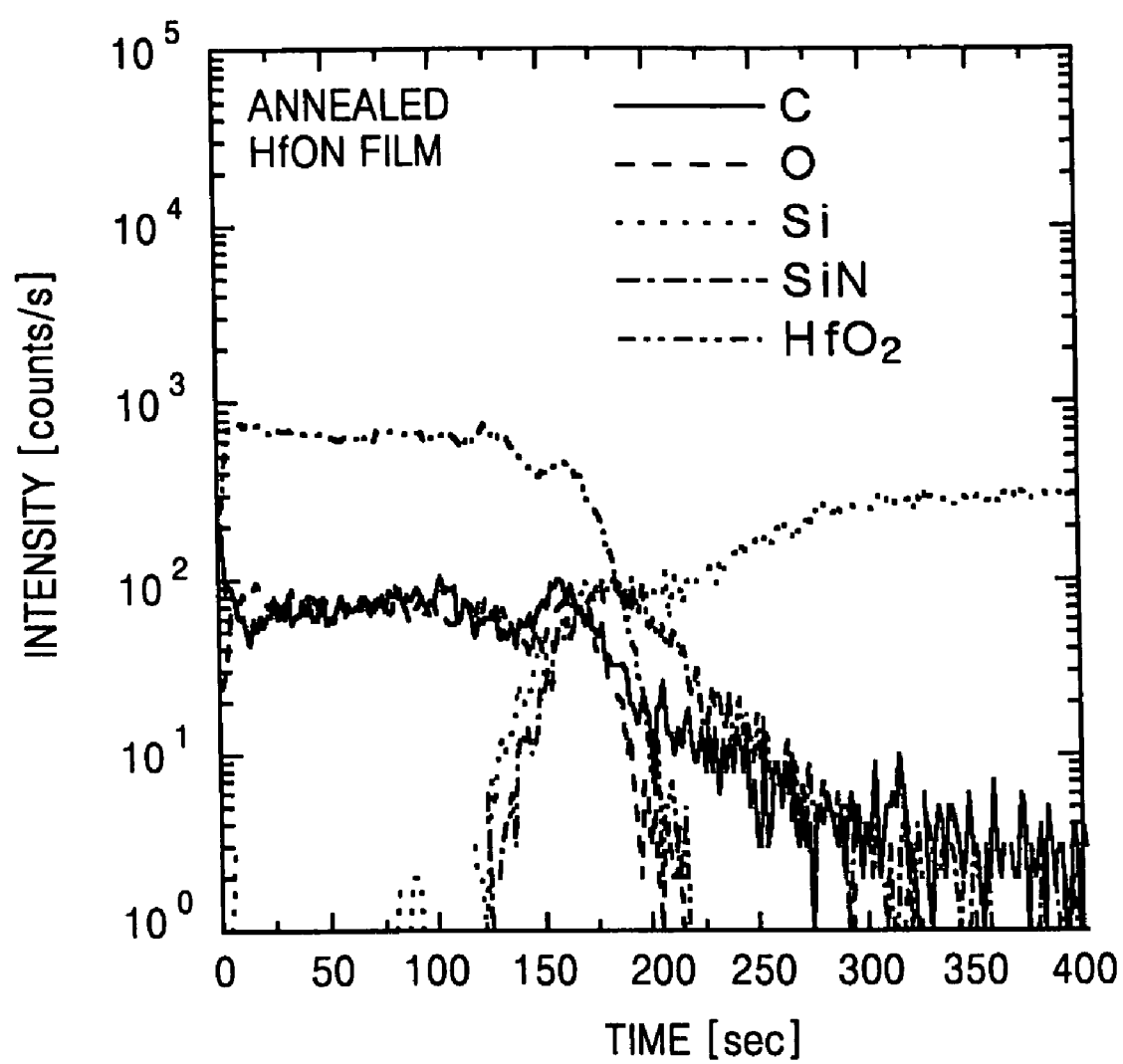
FIG. 3 is a graph showing a TOF-SIMS analysis of a conventional HfON film deposited by ALD and then annealed.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of films and regions may be exaggerated for clarity. Also, whenever the same element reappears in subsequent drawings, it is denoted by the same reference numeral.

Figure 4:
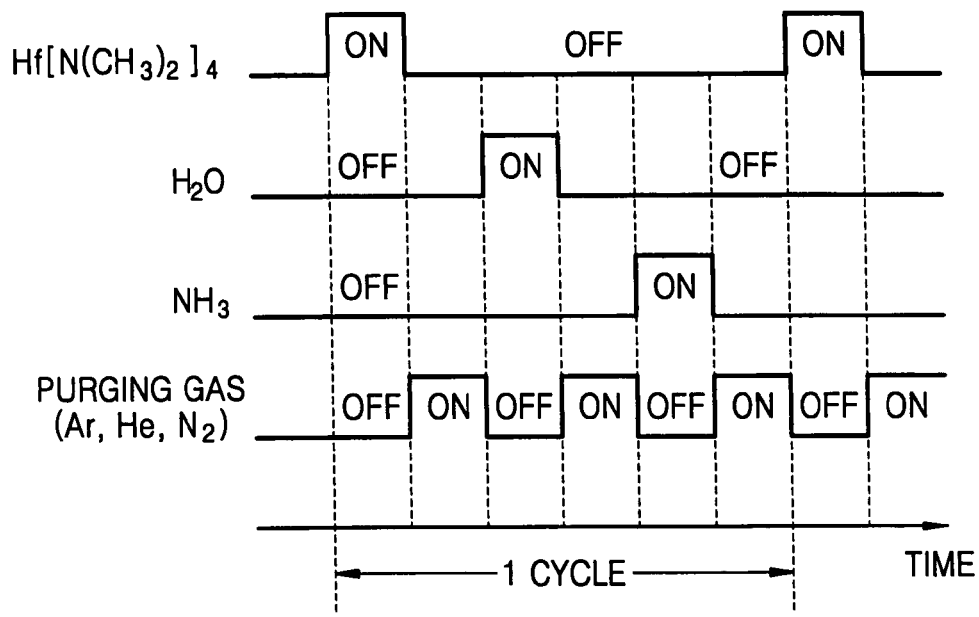
FIG. 4 shows gas pulsing diagrams illustrating a method of supplying gases when a high dielectric film is formed by ALD according to a first embodiment.

FIG. 4 shows gas pulsing diagrams illustrating a method of supplying gases when a high dielectric film is formed by ALD according to a first embodiment. In the present embodiment, an HfON film is formed as a high dielectric film, and TDMAH ($Hf[N(CH_3)_2]_4$) is used as an Hf precursor required for forming the HfON film. However, $Hf[N(C_2H_5)_2]_4$ or $Hf[N(C_2H_5)CH_3]_4$ can be used instead of $Hf[N(CH_3)_2]_4$.

Referring to FIG. 4, to form a gate insulating film, an Hf-containing chemisorbed film is formed on a semiconductor substrate by supplying the Hf precursor ($Hf[N(CH_3)_2]_4$) to the semiconductor substrate. Thereafter, a reactor is purged using a purging gas, such as Ar gas, He gas, or $N_2$ gas, to remove physisorbed Hf compounds or CH radicals from the semiconductor substrate.

Next, $H_2O$ is supplied to the semiconductor substrate to oxidize an Hf compound (HfN) that is chemisorbed to the semiconductor substrate. The HfN film is oxidized by supplying $H_2O$, thus forming an HfON film. The HfN film can be oxidized using another oxidizer, such as $O_3$, $H_2O_2$, $CH_3OH$, $C_2H_5OH$, or $C_3H_7OH$, instead of $H_2O$. After the HfN film is oxidized, the reactor is purged using a purging gas, such as Ar gas, He gas, or $N_2$ gas, to remove remaining by-products or oxidizer. In spite of the purge step, CH radicals remain in the HfON film. That is, a considerable amount of carbon remains in the HfON film.

Thereafter, in order to remove the remaining CH radicals and improve thermal stability, $NH_3$ gas is supplied to the resultant structure for a predetermined amount of time so that nitrogen is injected into the HfON film. Thus, a large amount of carbon is removed from the HfON film, and the nitrogen is added to the HfON film. Then, the reactor is purged using a purging gas, such as Ar gas, He gas, or $N_2$ gas, to remove remaining by-products. Thus, one cycle of forming the HfON film according to this embodiment is finished. By repeating the cycle several times, the HfON film can be formed to a desired thickness.

As described above, after the $H_2O$ oxidizer is supplied, the $NH_3$ gas, which is used for ALD, is supplied to the semiconductor substrate. Thus, the amount of carbon remaining in the HfON film is reduced and the thermal stability of the HfON film is improved. Also, by controlling the flow rate of the $NH_3$ gas, the amount of nitrogen contained in the HfON film can be properly controlled. Thus, the electrical characteristics, especially the leakage current characteristic of the HfON film, are greatly improved. In the present embodiment, the HfON film is formed by supplying the Hf precursor, purging the reactor, supplying the oxidizer, purging the reactor, supplying the $NH_3$ gas, and then purging the reactor. However, the steps of supplying the $NH_3$ gas and purging the reactor can be performed before the steps of supplying the oxidizer and purging the reactor, or the oxidizer and the $NH_3$ gas can be simultaneously supplied. Also, in the present embodiment, the $NH_3$ gas is used to remove remaining carbon from the HfON film and add nitrogen to the HfON film, but $N_2O$ gas, NO gas, or $NH_3$-plasma gas can be used instead of the $NH_3$ gas.

Figure 5:
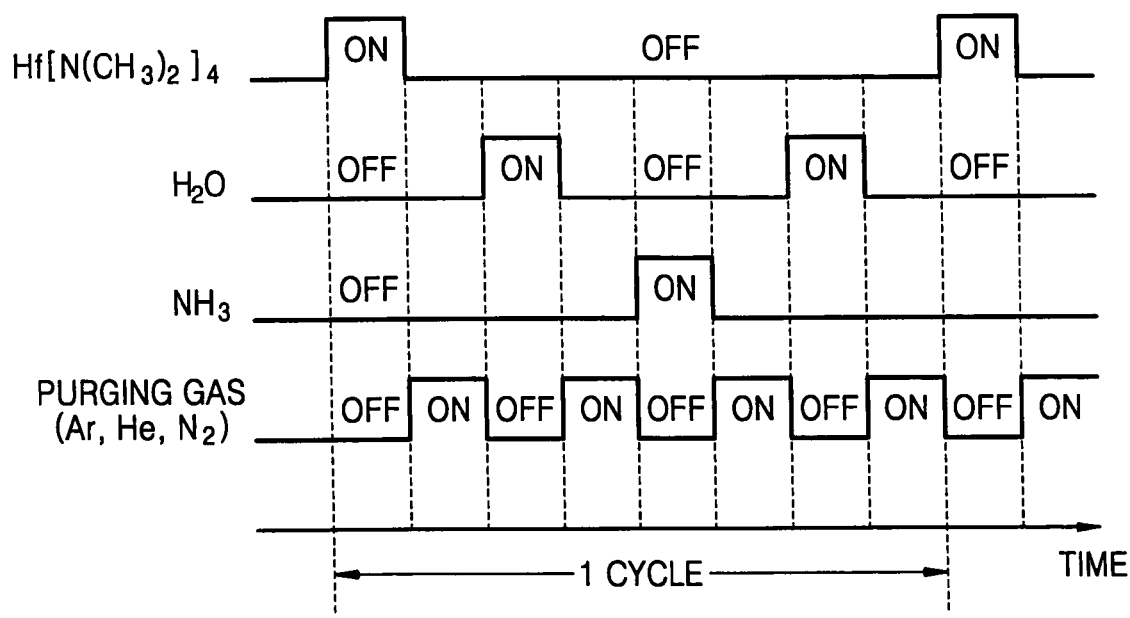
FIG. 5 shows gas pulsing diagrams illustrating a method of supplying gases when a high dielectric film is formed by ALD according to a second embodiment.

FIG. 5 shows gas pulsing diagrams illustrating a method of supplying gases when a high dielectric film is formed by ALD according to a second embodiment. The second embodiment is similar to the first embodiment except that after $NH_3$ gas is supplied and the reactor is purged, the method further comprises supplying an $H_2O$ oxidizer and purging the reactor.

Referring to FIG. 5, to form a gate insulating film, an HfN film is formed by supplying $Hf[N(CH_3)_2]_4$ to a semiconductor substrate and purging a reactor. Thereafter, an $H_2O$ oxidizer is supplied and the reactor is purged to oxidize the HfN film, thus forming an HfON film in which a large amount of carbon remains. Then, $NH_3$ gas is supplied and the reactor is purged to remove the remaining carbon from the HfON film and to add nitrogen to the HfON film. Thus, the electrical characteristics and thermal stability of the HfON film can be improved.

Thereafter, an $H_2O$ oxidizer is supplied once more and the reactor is purged. If the $H_2O$ oxidizer is supplied after the $NH_3$ gas is supplied, $O_2$ is additionally supplied to the HfON film, which makes the HfON film denser. This further improves the thermal and mechanical characteristics of the high dielectric HfON film. This one cycle is continuously repeated until the HfON film is formed to a desired thickness.

Figure 6:
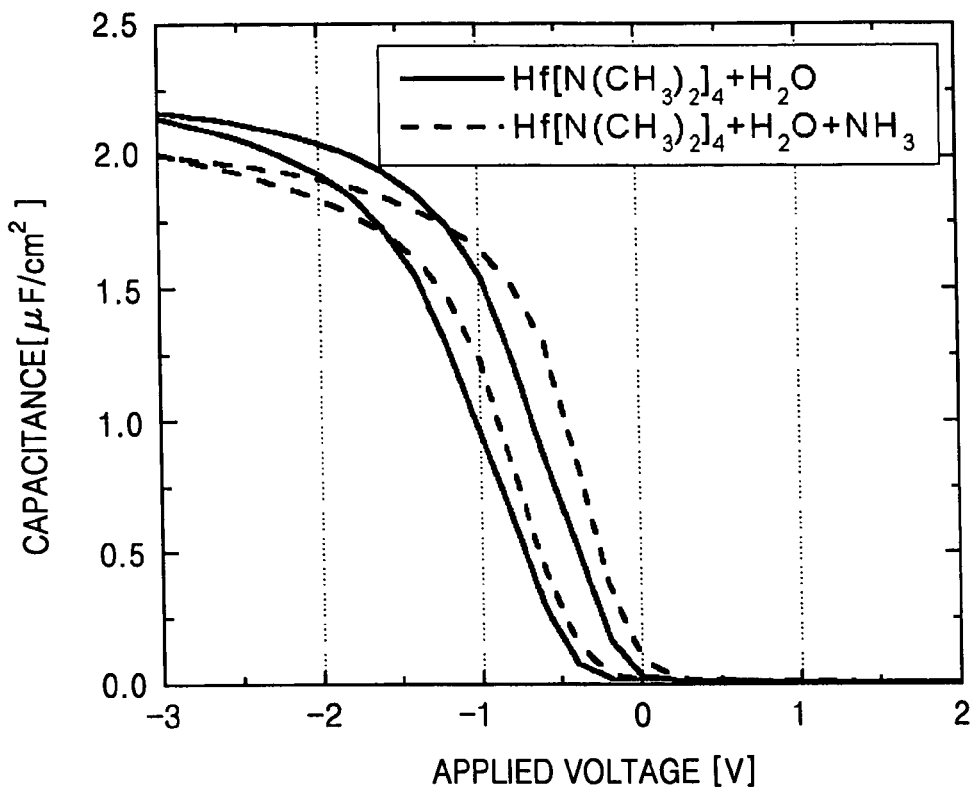
FIG. 6 is a graph of capacitance versus applied voltage (C—V) of a MOS transistor that uses a conventional HfON film as a gate insulating film, and a MOS transistor that uses as a gate insulating film an HfON film formed according to a method illustrated in FIGS., 4 and 5.
Figure 7:
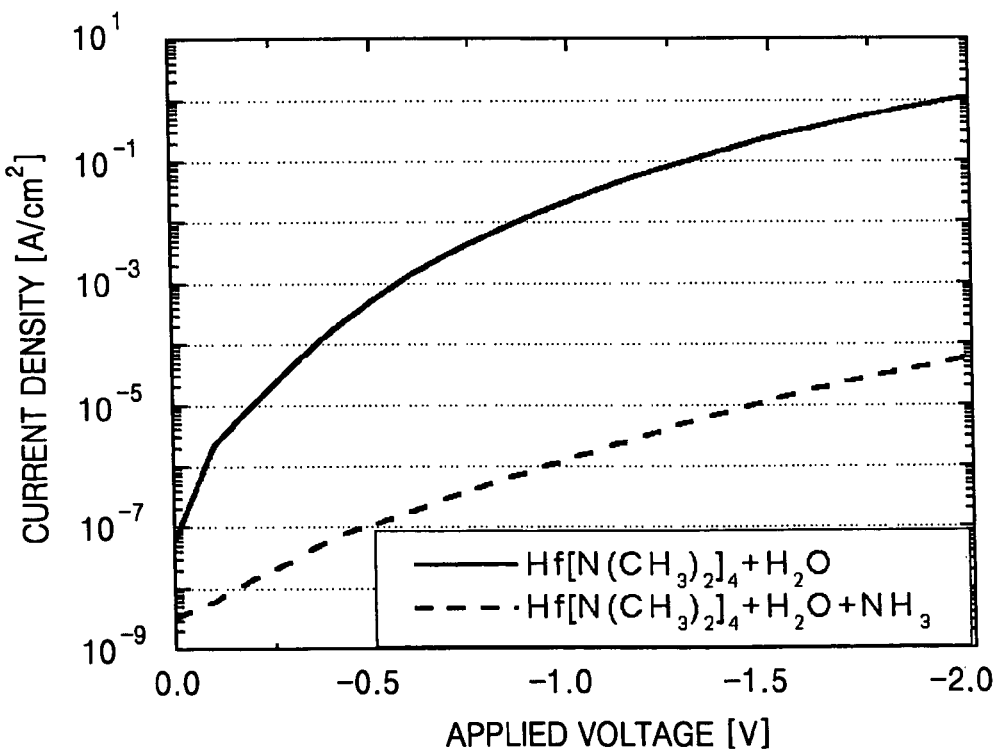
FIG. 7 is a graph of current density versus applied voltage of a MOS transistor that uses a conventional HfON film as a gate insulating film, and a MOS transistor that uses an HfON film as a gate insulating film.

FIG. 6 is a graph of capacitance versus applied voltage (C—V) of a MOS transistor that uses a conventional HfON film as a gate insulating film, and a MOS transistor that uses an HfON film formed according to the methods of FIGS. 4 & 5, as a gate insulating film. FIG. 7 is a graph of current density versus applied voltage of a MOS transistor that uses a conventional HfON film as a gate insulating film, and a MOS transistor that uses an HfON film formed according to the methods of FIGS. 4 & 5, as a gate insulating film. In FIGS. 6 and 7, the characteristics of the conventional HfON film are plotted with the solid curves. The two solid curves were generated by varying the applied voltage from 2V to −3V in one case, and from −3V to 2V in the other case. Meanwhile, the characteristics of the HfON film formed according to the methods of FIGS. 4 & 5 are plotted with dashed, or dotted, curves. Again, the two dotted curves were generated by varying the applied voltage from 2V to −3V in one case, and from −3V to 2V in the other case.

Referring to FIG. 6, the capacitance obtained in the conventional case that does not employ the $NH_3$ gas hardly differed from the capacitance obtained when the $NH_3$ gas is supplied and the reactor is purged, as described above. However, as shown in FIG. 7, the leakage current of the HfON film formed according to the methods of FIGS. 4 & 5 was less than $\frac{1}{1000}$ times a leakage current of the conventional HfON film. When the HfON film was formed using ALD by supplying the $NH_3$ gas, even if the capacitance was the same as obtained by the conventional method, defects such as carbon in the HfON film were reduced, so that the leakage current of the HfON film could be reduced to less than one one-thousandth of the leakage current of the conventional HfON film. Although a high dielectric film is used as a gate insulating film in the present embodiment, it can also be used as a capacitor dielectric film. That is, a high dielectric film can be formed on a capacitor lower electrode using the foregoing method, and thus it is possible to manufacture a capacitor having high capacitance and excellent electrical characteristics.

In the foregoing embodiments, a method of forming an HfON film using an Hf precursor was described. However, the HfON film can be replaced by one of N-augmented $ZrO_2$, N-augmented ZrON, N-augmented $Al_2O_3$, N-augmented $Ta_2O_5$, N-augmented $TiO_2$, N-augmented $SrTiO_3$, N-augmented TiAlO, N-augmented HfAlO, N-augmented HfTiO, and a combination of any of the foregoing.

Figure 8:
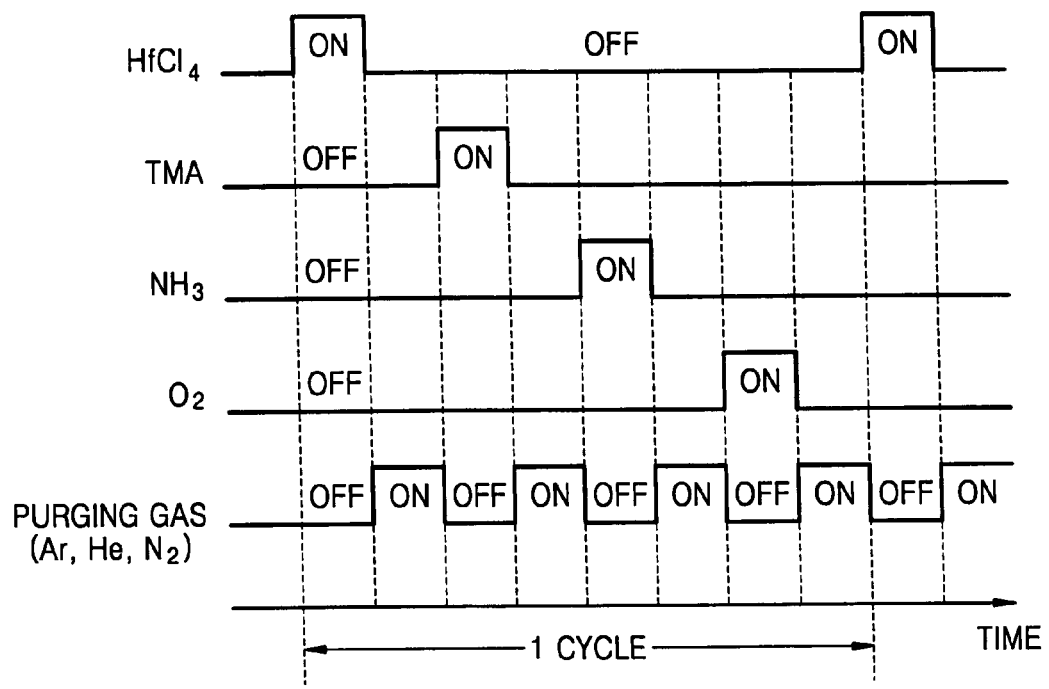
FIG. 8 shows gas pulsing diagrams illustrating a method of supplying gases when a high dielectric film is formed by ALD according to a third embodiment.

FIG. 8 shows gas pulsing diagrams illustrating a method of supplying gases when a high dielectric film is formed by ALD according to a third embodiment. In this embodiment, a high dielectric combination film formed of a first metal element and a second metal element is formed using ALD. Although Hf is used as the first metal element and Al is used as the second metal element in this embodiment, other metals, such as Ta, Ti, and La, can be used as the first or second metal element. However, the first metal element should be different from the second metal element.

In the present embodiment, $HfCl_4$ gas is used as an Hf-containing precursor (a first reaction source). If Ti is the first metal element, $TiCl_4$ gas can be used as a precursor. Also, TriMethyl aluminum (TMA) is used as an Al-containing precursor (a second reaction source). TriEthyl Aluminum (TEA) can be used instead of TMA.

Also, $NH_3$ gas is used as a third reaction source containing N, and $O_2$ is used as an oxidizer. However, $N_2$ can be used as the third reaction source instead, and the $O_2$ oxidizer can be replaced by $O_3$ or $H_2O$. Every step of supplying a reaction source is directly followed by a purge step, which uses an inert gas such as Ar, He, or Ne, or $N_2$ gas as a purging gas.

Referring to FIG. 8, the $HfCl_4$ gas is supplied as the first reaction source to a semiconductor substrate on which a lower electrode is formed, thereby forming an Hf-containing chemisorbed film. Next, a reactor is purged using the purging gas such as Ar to remove physisorbed Hf compounds or other by-products from the semiconductor substrate. Then, TMA is supplied as the second reaction source to the Hf-containing chemisorbed film, thereby forming an Al-containing chemisorbed film. Here, a reaction between an Hf atomic film and an Al atomic film is generated only on the surface of the Hf atomic film. The reactor is purged using the purging gas to remove by-products of the TMA.

Thereafter, to add the N, the $NH_3$ gas is supplied as the third reaction source to the chemisorbed film or the reactant material, thereby nitriding the chemisorbed material. By adding the nitrogen to the chemisorbed material, the crystallization temperature of the resulting high dielectric film can be increased. Thus, the high dielectric film can remain amorphous so that a leakage current between crystal grains can be prevented. Thereafter, remaining by-products are removed in a subsequent purge step.

Thereafter, the $O_2$ gas is supplied to oxidize the nitride combination film. The nitride combination film is oxidized by the $O_2$ and becomes an HfAlON film. Then, remaining by-products are removed by a subsequent purge step. As a result, one cycle is completed. The same one cycle is repeated continuously until the HfAlON film is formed to a desired thickness.

However, since the HfAlON film obtained by the foregoing method is not very dense, it can be vulnerable to leakage current. Accordingly, a subsequent annealing process can be performed to make the HfAlON film denser. The HfAlON film is annealed at a temperature between room temperature and 600° C., under a pressure of about 0.1 to 760 Torr. Also, the annealing process is performed in an atmosphere of $O_2$, $O_3$, $N_2O$, Ar, $N_2$, $H_2$, He, $NH_3$, or a combination thereof. Preferably, the HfAlON film is annealed in an $O_2$-containing atmosphere to add $O_2$ thereto. The annealing process can be performed using an additional energy source, such as $O_3$, plasma-$O_2$, and UV-$O_3$.

As described above, supplying $HfCl_4$, purging the reactor, supplying TMA, purging the reactor, supplying $NH_3$, purging the reactor, supplying $O_2$, and purging the reactor are sequentially performed to form a high dielectric combination film in the third embodiment. Unlike a conventional dielectric combination film, the high dielectric combination film formed according to the present embodiment is not formed of two different kinds of laminated metal oxynitride films or metal oxide films, but is formed of a mixture of two different kinds of metal elements. That is, the HfAlON film is not formed of laminated HfON and AlON, but is formed of a mixture of Hf atoms and Al atoms.

If a dielectric film is formed by laminating an HfON film and an AlON film using ALD, exceedingly numerous processes are required, namely: supplying $HfCl_4$, supplying $NH_3$, purging the reactor (or $N_2$-annealing), supplying $O_2$, purging the reactor, supplying TMA, purging the reactor, supplying $NH_3$, purging the reactor (or $N_2$-annealing), supplying $O_2$, and purging the reactor. However, since deposition of a mixture of Hf and Al is followed by supplying $NH_3$ (nitridation) and supplying $O_2$ (oxidation), the number of processes can be reduced to facilitate mass production.

Also, to increase the crystallization temperature of the HfAlON film, the Al content should be increased. However, in the present embodiment, by adding nitrogen to the HfAlO film, the crystallization temperature and the dielectric constant of the HfAlON film can be increased with only a small amount of Al, and diffusion of impurities can be effectively prevented.

Figure 9:
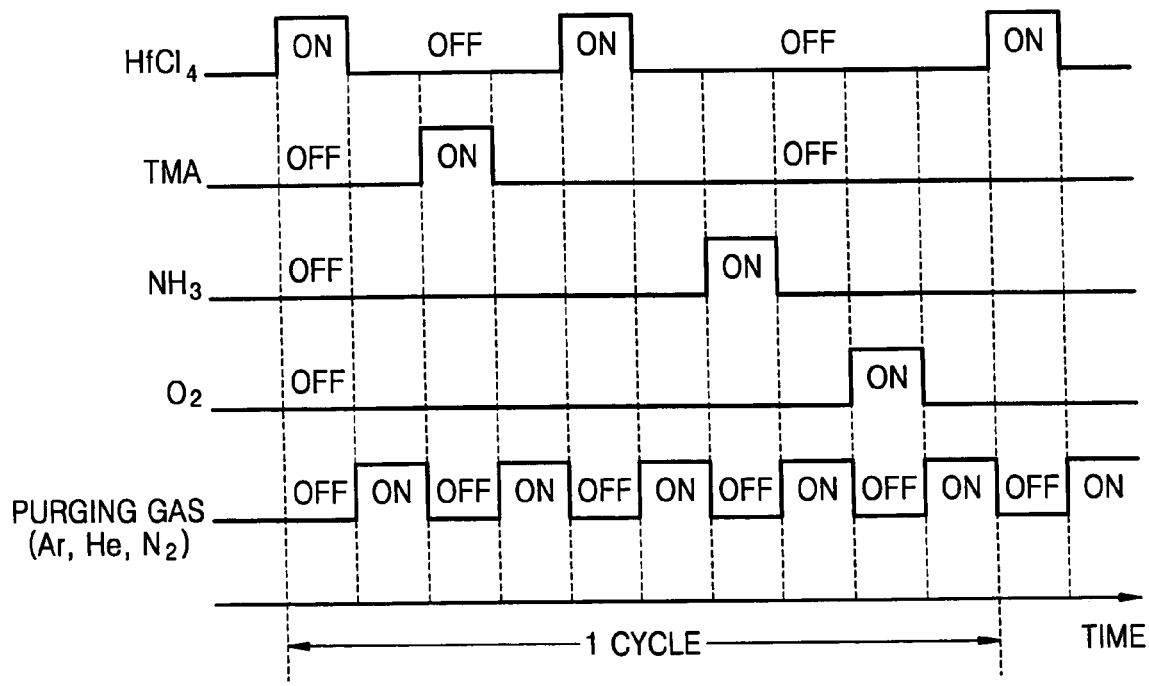
FIG. 9 shows gas pulsing diagrams illustrating a method of supplying gases when a high dielectric film is formed by ALD according to a fourth embodiment.

FIG. 9 shows gas pulsing diagrams illustrating a method of supplying gases when a high dielectric film is formed by ALD according to a fourth embodiment. The present embodiment is the same as the third embodiment described with reference to FIG. 8 except that a process of supplying $HfCl_4$ (a first reaction source) and purging a reactor is further performed between a process of supplying TMA (a second reaction source) and purging the reactor, and a process of supplying $NH_3$ and purging the reactor.

Referring to FIG. 9, steps of supplying $HfCl_4$ and purging the reactor are additionally performed for one cycle, thereby increasing a ratio of Hf to Hf+Al in the HfAlON film. The same one cycle is continuously repeated until the HfAlON film is formed to a desired thickness. As a result, an Hf-rich HfAlON film can be obtained.

Figure 10:
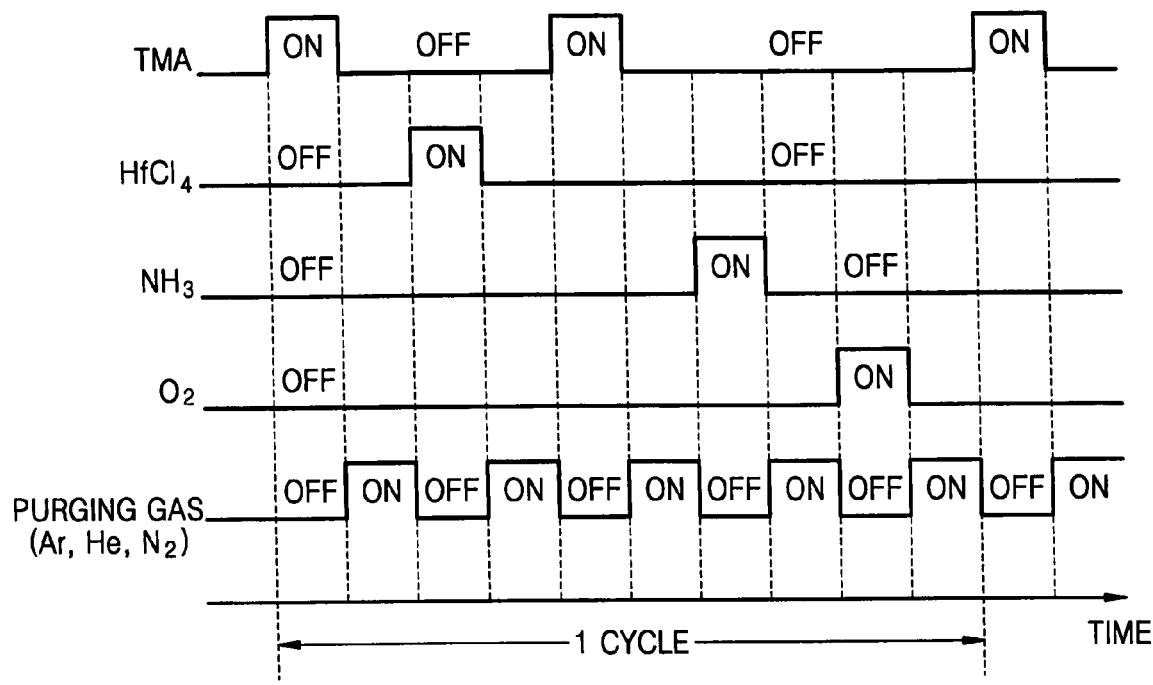
FIG. 10 shows gas pulsing diagrams illustrating a method of supplying gases when a high dielectric film is formed by ALD according to a fifth embodiment.

FIG. 10 shows gas pulsing diagrams illustrating a method of supplying gases when a high dielectric film is formed by ALD according to a fifth embodiment. The present embodiment is the same as the third embodiment described with reference to FIG. 8, except that a process of supplying TMA (a first reaction source) and purging the reactor is additionally performed between a process of supplying $HfCl_4$ and purging the reactor and a process of supplying $NH_3$ and purging the reactor.

Referring to FIG. 10, steps of supplying TMA and purging the reactor are performed once more, thereby increasing a ratio of Al to Hf+Al in the HfAlON film, for one cycle. The same one cycle is continuously repeated until the HfAlON film is formed to a desired thickness. As a result, an Al-rich HfAlON film can be obtained.

Alternatively, a high dielectric film having a desired thickness and composition can be formed by combining at least two of the methods of the third, fourth, and fifth embodiments described with reference to FIGS. 8, 9, and 10. For example, after an HfAlON film is formed according to the method of the third embodiment, an Hf-rich HfAlON film may be formed according to the method of the fourth embodiment. Here, the number of cycles of the third embodiment and the number of cycles of the fourth embodiment should be controlled such that an HfAlON film having a desired thickness and composition can be formed by repeating the cycles of the third and fourth embodiments.

Hereinafter, a method of manufacturing a capacitor will be described with reference to FIGS. 11 through 16. In the present embodiment, a high dielectric oxynitride film formed of two kinds of metal elements, as described with reference to FIGS. 8 through 10, is manufactured as a capacitor dielectric film.

Figure 11:
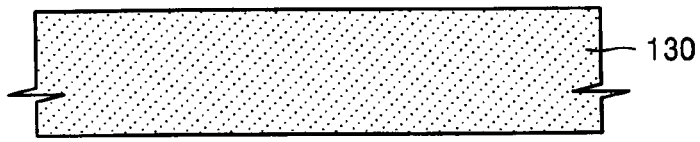
FIGS. 11 through 15 are cross-sectional views illustrating a method of manufacturing a capacitor.

Referring to FIG. 11, a lower electrode 130 is formed on a semiconductor substrate (not shown). The lower electrode 130 can be formed of doped silicon or polysilicon, or a conductive metal, metal oxide, metal nitride, or metal oxynitride can be used instead of doped silicon or polysilicon. The lower electrode 130 can have a 3-dimensional shape, such as a stack shape, a trench shape, or a cylindrical shape.

Figure 12:
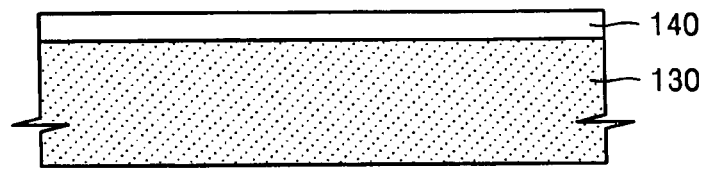

Referring to FIG. 12, a pretreatment film 140 is formed on the lower electrode 130. The pretreatment film 140 is formed to prevent any reaction or diffusion between the lower electrode 130 and a dielectric film to be formed later (refer to 150 of FIG. 13 or 155 of FIGS. 14 and 15).

If the lower electrode 130 is formed of silicon, the pretreatment film 140 is generally formed using rapid thermal nitridation (RTN) or rapid thermal oxidation (RTO). Alternatively, the pretreatment film 140 can be formed using CVD. By these methods, the pretreatment film 140 is formed of silicon oxide, silicon nitride, or silicon oxynitride to a thin thickness. The pretreatment film 140 prevents reaction or diffusion between the lower electrode 130 and the dielectric film 150 or 155, and suppresses deterioration of the dielectric film 150 or 155. Also, the pretreatment film 140 disperses an electric field that is directly applied to the dielectric film 150 or 155 and reduces a leakage current during the operation of a semiconductor device. The RTN is performed in an atmosphere of $NH_3$ or $N_2$ at a temperature of about 500° C. to 900° C., whereas the RTO is performed in an atmosphere of $O_2$ or $N_2O$ at a temperature of 500° C. or 900° C. When the RTN or RTO is performed, an energy source such as plasma, light rays, or infrared rays can be used to lower the activation energy.

Figure 13:
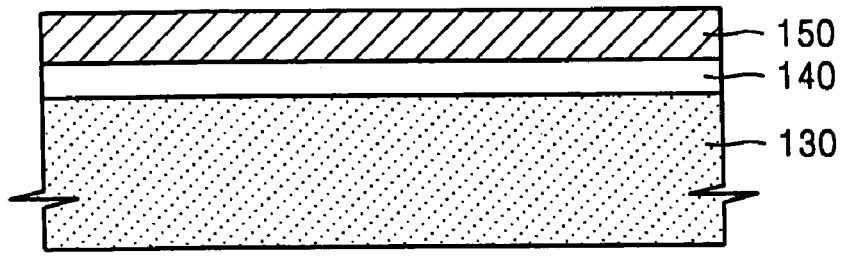

Referring to FIG. 13, a high dielectric film 150 formed of two kinds of metal elements is formed on the pretreatment film 140 by the method illustrated above with reference to FIGS. 8 through 10. Since the method of forming the high dielectric film 150 is described in the third through fifth embodiments, a description thereof will not be repeated here. The resulting high dielectric film 150 can be an HfTiON film, an HfTaON film, a TiTaON film, or an HfTiON film, instead of the HfAlON film that is described in the third through fifth embodiments. That is, the high dielectric film 150 can be an oxynitride combination film formed of two different kinds of metal elements, i.e., a first metal element and a second metal element, each of which is selected from the group consisting of Ta, Hf, Ti, Al, and La.

Figure 14:
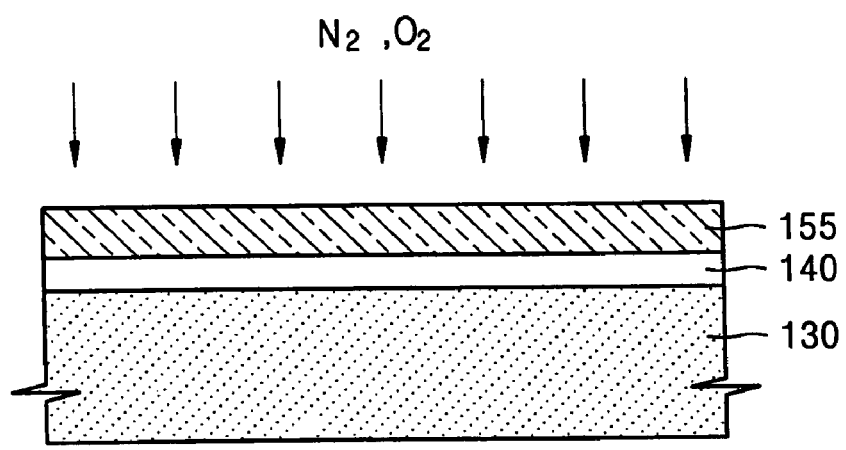

Referring to FIG. 14, the high dielectric film 150, formed by ALD, is annealed and becomes a densified high dielectric film 155. Since the high dielectric film 150 as deposited is not very dense, it may be vulnerable to leakage current. Thus, the annealing process is required to make the high dielectric film 150 denser. The high dielectric film 150 can be annealed at any temperature from room temperature to 600° C., under a pressure of about 0.1 to 760 Torr, in an atmosphere Of $O_2$, $O_3$, $N_2O$, Ar, $N_2$, $H_2$, He, $NH_3$, or a combination thereof. Normally, the annealing process is performed in an $O_2$ atmosphere to add $O_2$ to the dielectric film 150. In the present embodiment, the annealing process is performed in an atmosphere containing $O_2$ and $N_2$. Here, additional energy can be supplied using $O_3$, plasma-$O_2$, or UV-$O_3$.

Figure 15:
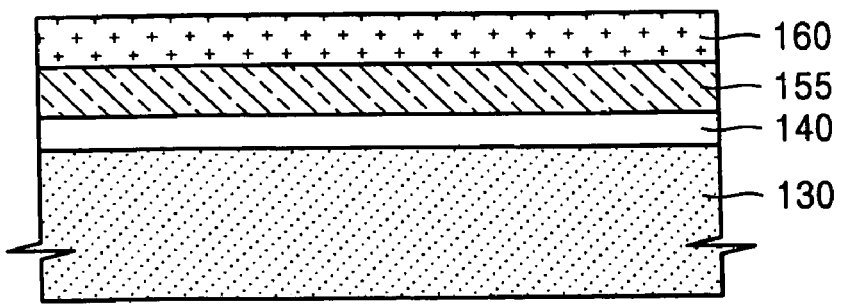

Referring to FIG. 15, an upper electrode 160 is formed on the high dielectric film 155. The upper electrode 160 is formed of silicon, a metal, conductive metal oxide, conductive metal nitride, or conductive metal oxynitride. Also, to suppress a reaction between the high dielectric film 155 and the upper electrode 160, the upper electrode 160 can be formed of TiNx. This TiNx film hardly reacts with the dielectric film 155, thus preventing deterioration of the dielectric film 155.

Figure 16:
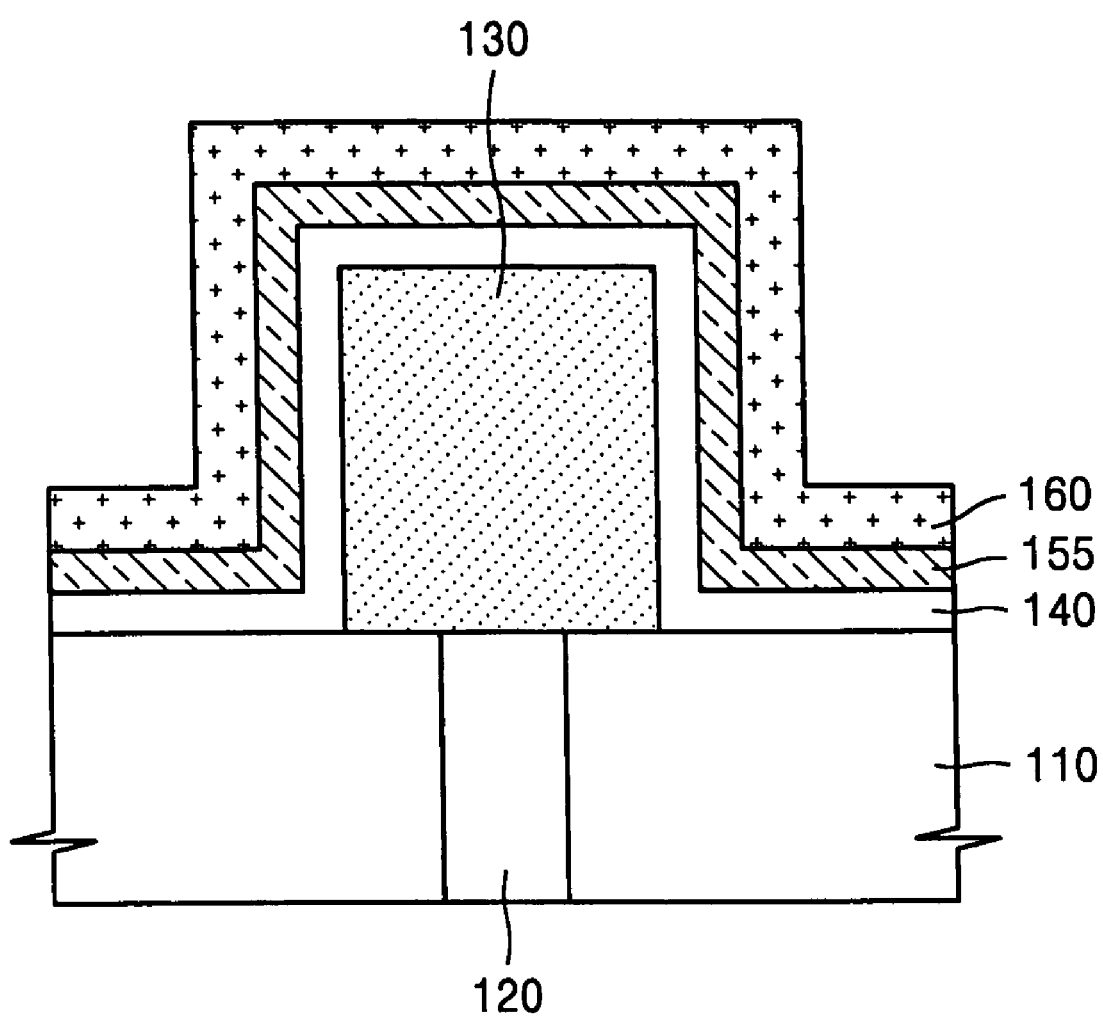
FIG. 16 is a cross-sectional view of a capacitor manufactured by the method shown in FIGS. 11 through 15.

FIG. 16 is a cross-sectional view of a capacitor manufactured by the method described with reference to FIGS. 11 through 15. Although a stack-type capacitor is shown in FIG. 16, the capacitor can be formed in a trench or cylindrical shape instead. According to the foregoing method of manufacturing a capacitor, the lower electrode 130, the pretreatment film 140, the high dielectric film 155, and the upper electrode 160 are sequentially laminated on an interlayer dielectric film 110 in which a plug 120 is formed, all disposed on a semiconductor substrate 100. Thus, a capacitor, shown in FIG. 16, is completed.

As explained thus far, $N_2$ is supplied to a high dielectric film and a reactor is purged, using ALD. Thus, defects such as carbon are reduced, so that a leakage current characteristic is improved. Also, since the amount of nitrogen in the high dielectric film, which is used as a gate insulating film or a capacitor dielectric film, can be precisely controlled, its electrical and thermal characteristics can be greatly improved. Further, as a mixture of first and second metal elements are deposited, nitrided, and then oxidized, the number of processes required for forming a high dielectric film or a capacitor having the high dielectric film can be reduced, thereby facilitating mass production.

Also, nitrogen is added to an oxide film containing the first and second metal elements so that the crystallization temperature and dielectric constant of the dielectric film can be increased. Accordingly, a sufficient capacitance can be obtained. In addition, a high dielectric film having a good step coverage characteristic can be formed on a 3-dimensional lower electrode, exhibiting a desired thickness and composition.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming an HfON film using atomic layer deposition, the method comprising performing a plurality of cycles one after another, each cycle comprising, in order:
   (a) supplying an Hf precursor selected from the group consisting of $Hf[N(CH_3)_2]$ and $Hf[N(C_2H_5)CH_3]_4$ to a semiconductor substrate disposed in a reactor, and then purging the reactor;
   (b) subsequent to step (a), supplying an oxidizer to the semiconductor substrate, and then purging the reactor; and
   (c) subsequent to step (b), supplying a reaction source selected from the group consisting of $NH_3$ gas, $N_2O$ gas, NO gas, and $NH_3$ plasma to the semiconductor substrate, and then purging the reactor; and
   (d) subsequent to step (c), supplying an oxidizer and purging the reactor.

2. The method of claim 1, wherein the oxidizer is one selected from the group consisting of $O_3$, $H_2O$, $H_2O_2$, $CH_3OH$, $C_2H_5OH$, and $C_3H_7OH$.

3. The method of claim 1, wherein the HfON film is formed to insulate a gate of a semiconductor device.

4. The method of claim 1, wherein the HfON film is formed between two electrodes as a capacitor dielectric film.

* * * * *